(12) United States Patent
Krishna

(10) Patent No.: US 9,614,517 B2
(45) Date of Patent: Apr. 4, 2017

(54) ADAPTIVE SLEW RATE CONTROL FOR SWITCHING POWER DEVICES

(71) Applicant: Texas Instruments Incorporated, Dallas, TX (US)

(72) Inventor: Kannan Krishna, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/796,749

(22) Filed: Jul. 10, 2015

(65) Prior Publication Data

US 2017/0012618 A1    Jan. 12, 2017

(51) Int. Cl.
| | | |
|---|---|---|
| H03B 1/00 | (2006.01) |
| H03K 17/16 | (2006.01) |
| H03K 5/156 | (2006.01) |
| H03K 7/08 | (2006.01) |

(52) U.S. Cl.
CPC ......... *H03K 17/165* (2013.01); *H03K 5/156* (2013.01); *H03K 7/08* (2013.01)

(58) Field of Classification Search
CPC .................................................. H03K 17/165
USPC .................................................. 327/109–112
See application file for complete search history.

(56) References Cited

U.S. PATENT DOCUMENTS

| | | | |
|---|---|---|---|
| 8,810,293 B2 | 8/2014 | Hesener | |
| 2008/0122488 A1* | 5/2008 | Chen | G11C 7/1051 326/82 |
| 2013/0063186 A1* | 3/2013 | DeBeer | H03K 17/164 327/109 |

\* cited by examiner

*Primary Examiner* — Lincoln Donovan
*Assistant Examiner* — Metasebia Retebo
(74) *Attorney, Agent, or Firm* — John R. Pessetto; Charles A. Brill; Frank D. Cimino

(57) ABSTRACT

An adaptive driver includes a gate driver having at least one driving transistor for driving a control node of switching transistor(s) that includes an output node (OUT) which provides Vout. An adjustable current source is in series with the driving transistor, a high pass filter (HPF) is between OUT and ground for detecting a slew rate of the switching transistor and outputting a voltage pulse (Vslp) output having a peak voltage amplitude at least monotonically reflecting a slope of Vout during switching. Detection signal processing circuitry is coupled to the output of the HPF for processing Vslp and slew rate control circuitry has an input coupled to the output of the detection signal processing circuitry. The output of the slew rate control circuitry is coupled to the current source for controlling its current level for changing the slew rate of the switching transistor to provide a desired slew rate range.

16 Claims, 7 Drawing Sheets

ADAPTIVE SLEW RATE CONTROL FOR SWITCHING POWER DEVICES

FIELD

Disclosed embodiments relate to slew rate control circuits for switching power devices.

BACKGROUND

Switching power devices such as switching amplifiers (e.g. class D amplifiers) and switching power converters (e.g., buck or boost converters) are examples of electronic devices that switch their output node between essentially the positive power supply level and ground to deliver high power efficiency. The rate at which the output node of the switching power device moves between the power supply level and ground can result in undesirable artifacts in the form of electromagnetic interference (EMI). Slower switching is known to reduce EMI but reduce power efficiency.

SUMMARY

This Summary briefly indicates the nature and substance of this Disclosure. It is submitted with the understanding that it will not be used to interpret or limit the scope or meaning of the claims.

Disclosed embodiments recognize adaptive slew rate control for switching power devices such as switching amplifiers (e.g., class D amplifiers) and switching power converters (e.g., buck and boost converters) can account for integrated circuit (IC) ("chip") performance variations induced by processing, temperature and the effects of aging. Disclosed embodiments include drivers with adaptive slew rate control (adaptive driver) which comprise a gate driver including at least one driving transistor for driving a control node of at least one switching transistor within an output stage that includes an output node (OUT) which provides a voltage output (Vout). An adjustable current source is in series with the driving transistor. A high pass filter (HPF) is coupled between OUT and a ground for detecting a slew rate of the switching transistor by outputting a voltage pulse (referred to herein as Vslp) at its output having a peak voltage amplitude that at least monotonically reflects a slope of Vout (dVout/dt) during its switching transitions.

Detection signal processing circuitry is coupled to the output of the HPF for processing Vslp and outputting a processed detection signal. The slew rate control circuitry has an input coupled to the output of the detection signal processing circuitry for receiving the processed detection signal. An output of the slew rate control circuitry is coupled to the adjustable current source for controlling a level of current of the adjustable current source (current level), where the current level is for changing the slew rate of the switching transistor so that the slew rate is provided within a predetermined slew rate range.

BRIEF DESCRIPTION OF THE DRAWINGS

Reference will now be made to the accompanying drawings, which are not necessarily drawn to scale, wherein.

DETAILED DESCRIPTION

Figure 1:
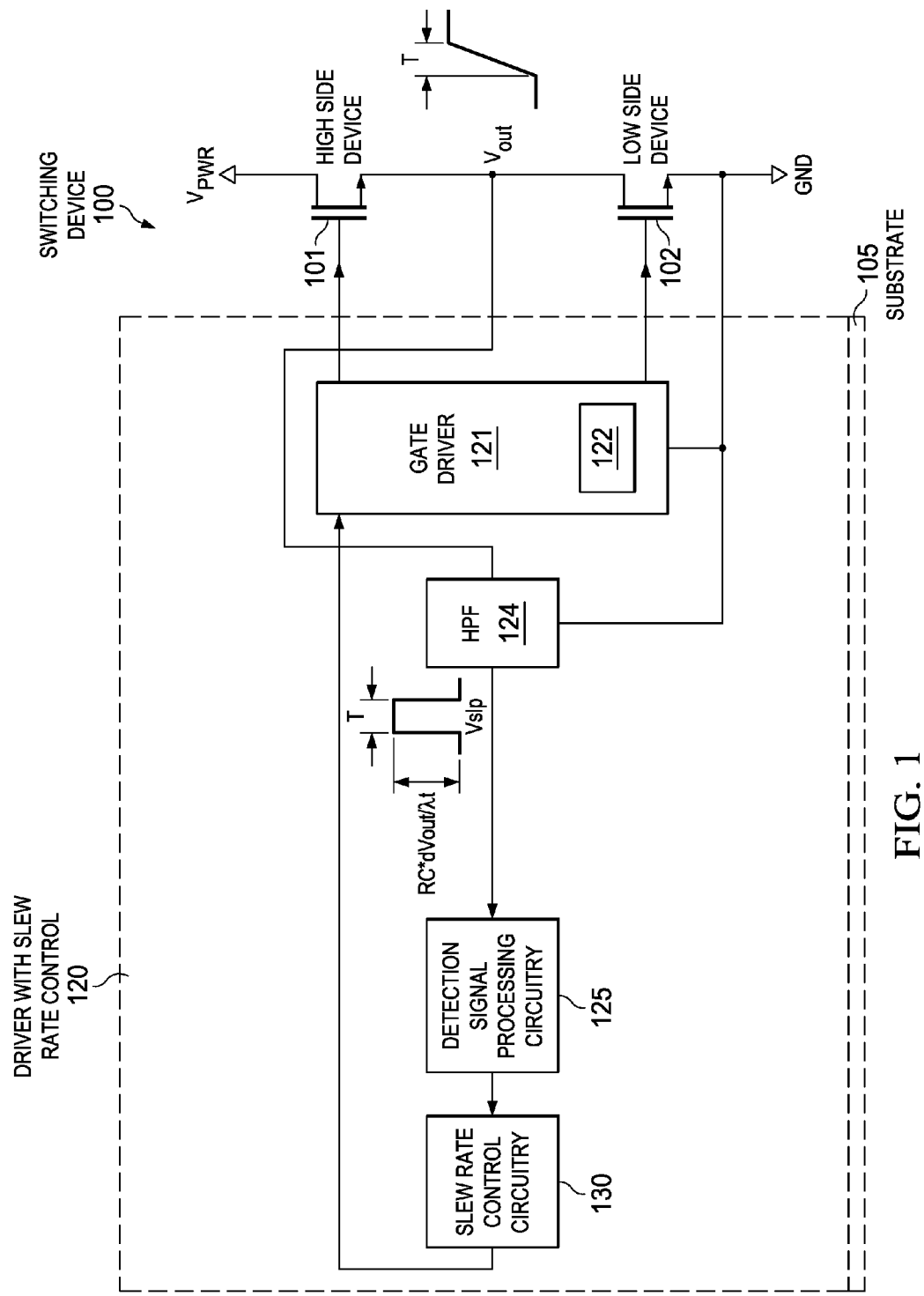
FIG. 1 is depiction of a switching device including an example gate driver with slew rate control shown in block diagram form, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is depiction of a switching device 100 including an example driver with adaptive slew rate control (adaptive driver) 120 shown in block diagram form, according to an example embodiment. The adaptive driver 120 is shown formed on a substrate 105 that has at least a semiconductor surface. The substrate 105 may comprise silicon, such as bulk silicon or silicon epi on a bulk silicon substrate. The substrate 105 may also generally comprise other materials, such as elementary semiconductors besides silicon including germanium. The substrate 105 may also generally comprise a compound semiconductor. In one embodiment the substrate 105 for the adaptive driver 120 is a first substrate material such as silicon, and the output stage is formed on separate second substrate having a second semiconductor surface such as gallium nitride (GaN) or silicon carbide (SiC) for high voltage applications.

The gate driver 121 shown includes at least one driving transistor, and generally two series connected driver transistors (see FIG. 2 described below), for driving a control node (e.g., a gate) of at least one switching transistor shown as NMOS power field effect transistors (FETs) 101 and 102 (switching transistors 101, 102) within an output stage that includes an output node (OUT) between the switching transistors 101, 102 which provides a voltage output (Vout). The drain of switching transistor 101 is shown connected to a power supply voltage shown as $V_{PWR}$ and the source of switching transistor 102 is shown connected to ground. At least one adjustable current source 122 (shown as a block in FIG. 1) is in series with the driving transistor(s) of the gate driver 121. The adjustable feature of the adjustable current source 122 allows for adaptive slew rate control. The current source symbol shown in FIG. 2 indicates that it is charging a capacitance, typically a gate capacitance. A conventional implementation for an adjustable current source 122 is a variable resistor. The power supply for the gate driver 121 for driving the output stage can generally be separate and thus different from the power supply for the output stage ($V_{PWR}$). However, in lower power applications (e.g. for cellphones) the power supplies may be the same.

A slew rate detection circuit comprises a HPF 124 that is coupled between OUT and a ground for detecting a slew rate of the switching transistors 101, 102 by outputting a voltage pulse shown as Vslp (shown having a voltage amplitude equal to (RC*dVout)/dt) and a pulse width T) at its output node having a peak voltage amplitude that at least monotonically reflects a slope of Vout (dVout)/dt) during its switching transitions. As long as this peak voltage amplitude dependence is monotonic (an increase in the Vout slope causes an increase/decrease in the Vslp peak amplitude) a disclosed adaptive control loop can generally operate easily. The case of direct proportionality (a linear dependence) makes the control loop implementation easier.

Detection signal processing circuitry 125 is coupled to the output of HPF 124 to process Vslp and output a processed detection signal. Detection signal processing circuitry 125 generally comprises a peak detection circuit that detects the peak amplitude of the Vslp waveform and provides a peak detector output (PDO). Slew rate control circuitry 130 has an input coupled to an output of the detection signal processing circuitry 125 to receive the PDO signal. An output of the slew rate control circuitry 130 is coupled to the adjustable current source 122 for controlling a level of current of the adjustable current source (current level), where the current level is for changing the slew rate of the switching device 100.

The HPF 124 can comprise a passive filter which is generally a first-order HPF that can be implemented with a simple series RC circuit. The HPF 124 embodied as a first order filter has a cutoff frequency fc=1/(2πRC) which is generally significantly lower than the frequency content of OUT which is used to sense and provide information on the slew rate of the switching device 100. The RC time constant should generally be small enough so the pulse-like Vslp signal across the sensing resistor in the passive HPF embodiment equal to (RC*dVout)/dt settles within the transition time of Vout. It is recognized the Vslp at the output node of the HPF 124 in the case of a series RC filter will have a height (voltage amplitude) that is proportional to the slew rate of OUT (dVout/dt) and a width that is equal to the rise/fall time (T) at OUT.

HPF 124 can also be an active filter. The HPF 124 as an active electronic filter can be a first-order high-pass filter including an operational amplifier. In this case for an inverting configuration, the active filter has a passband gain of $-R_2/R_1$ (R2 is feedback resistor and R1 is the input resistor) and has a cutoff frequency (fc) of:

$$f_c = \frac{1}{2\pi\tau} = \frac{1}{2\pi R_1 C}.$$

Vslp will not generally be affected by the height of the voltage step at OUT, only its slope. For an RC HPF 124, the capacitor C can comprise a high voltage capacitor which can tolerate a potentially large power supply voltage shown as $V_{PWR}$ and still provide a reasonable output to the detection signal processing circuitry 125 and the slew rate control circuitry 130. Vslp will be a positive going pulse during a positive transition at Vout and a negative pulse during a negative going transition.

Figure 2:
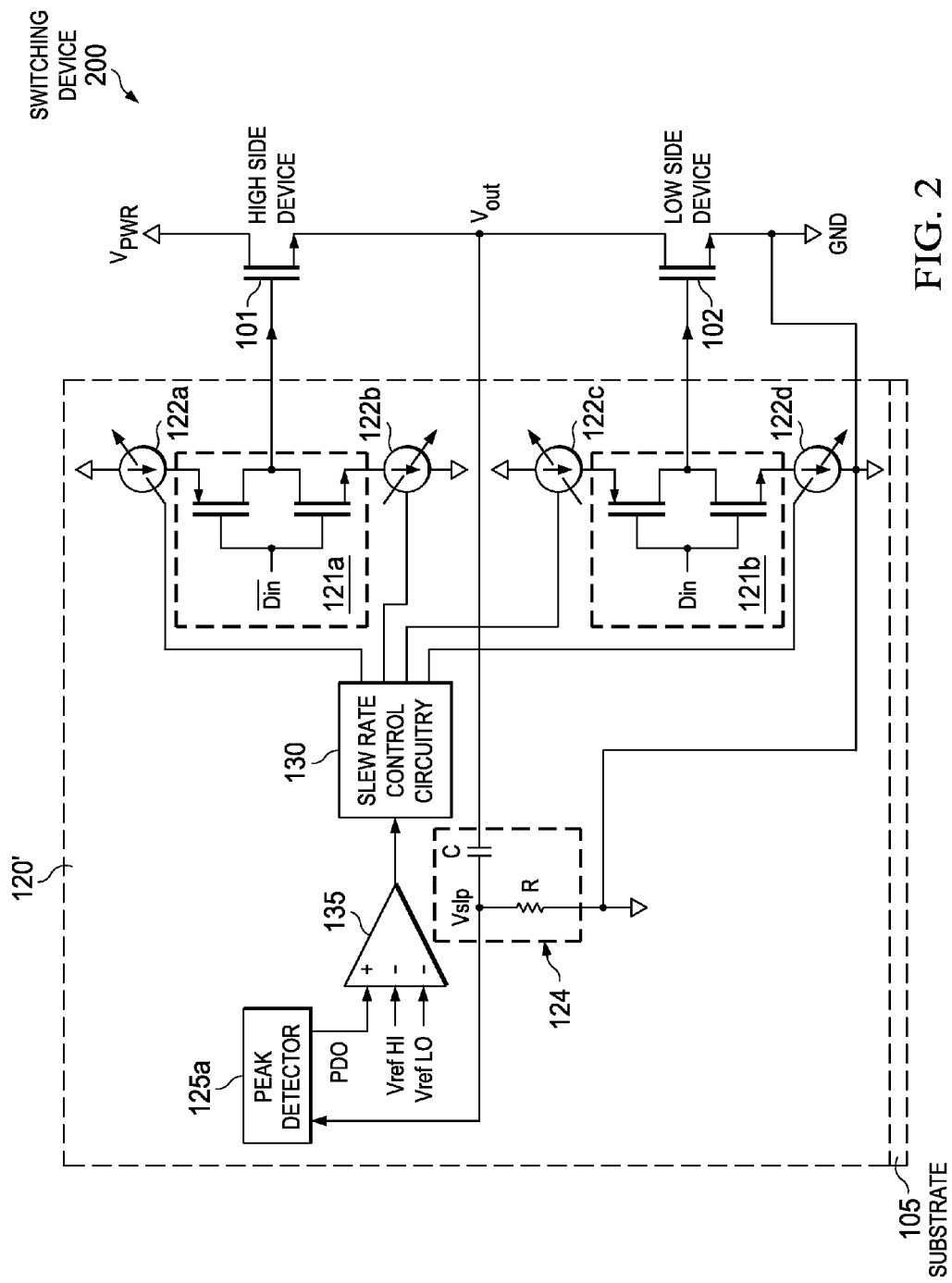
FIG. 2 is depiction of another example switching device including a disclosed example gate driver with slew rate control circuit, according to an example embodiment.

FIG. 2 shows a switching device 200 comprising an adaptive driver 120' including an example gate driver with slew rate control circuit 130, according to an example embodiment. In this embodiment the pulse height of Vslp is shown be detected with a peak detector 125a including a sample and hold (S/H) circuit which provides a peak detector output (PDO) as shown. As known in the art, a S/H circuit is an analog device that samples the voltage of a continuously varying analog signal and holds (locks) its value at a constant level for a specified minimum period of time. A typical sample and hold circuit stores electric charge across a capacitor and includes at least one relatively fast field effect transistor (FET) switch and at least one operational amplifier.

Using at least one comparator 135, the sampled analog output provided by the peak detector 125a can then be compared to at least one reference (e.g., two references shown as Vref Hi and Vref Lo) to determine whether the slew rate is within a desired range. If the slew rate is not within the desired (acceptable) range, the slew rate control circuitry 130 which has an input coupled to receive the output of the comparator 135 will adjust the current of the adjustable current source 122a coupled as a pullup to the positive supply and current source 122b coupled as a pulldown to the negative supply (each associated with gate driver 121a) and adjustable current source 122c coupled as a pullup and current source 122d coupled as a pulldown (each associated with gate driver 121b) which will adjust the slew rate of the switching device 200 so that the slew rate of Vout will fall within the desired slew rate range. Although the adjustable current sources 122a-122d are shown in FIG. 2 each provided with separate control by slew rate control circuitry 130, the adjustable current sources can be implemented with a single control where the pullup and pulldown currents are the same. Gate drivers are shown as 121a and 121b which are shown receiving an input shown as Din complement and Din, respectively, generally from a pulse width modulation (PWM) driver (not shown).

Vslp will have a magnitude that only depends on the slope of Vout (not its absolute voltage). The variation in the RC scale factor due to PVT (process, voltage, temperature) variations) can be trimmed out using a fixed frequency input clock as reference (see FIG. 5 described below). The R for HPF 124 can be chosen to be small enough so only the C is subjected to the full voltage swing at Vout. A relatively small R also allows Vslp to settle quickly. Vslp can be in a low voltage range which allows associated circuits in the control loop such as detection signal processing circuitry 125 and slew rate control circuitry 130 to use a fine-line (small geometry) CMOS process which generally results in devices that are not high voltage tolerant and thus generally need to be operated using relatively low operating voltages.

Figure 3:
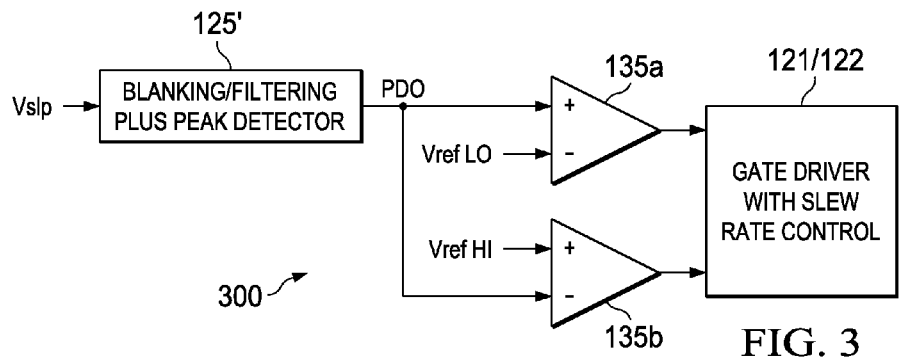
FIG. 3 shows an example blanking, peak detector, and filtering circuit for signal processing Vslp, according to an example embodiment.

FIG. 3 shows an example blanking, peak detector, filtering circuit 300 for processing Vslp. The blanking/filtering and peak detector is shown as 125', comparators are shown as 135a for comparing Vref Lo to the output of the blanking/filtering and peak detector 125' (Vslp after processing by blanking/filtering and peak detector 125') and 135b for comparing Vref Hi to the output of the blanking/filtering and peak detector 125', and the gate driver with slew rate control block shown as 121/122. The blanking function performs windowing that allows only the relevant part of the output waveform to be processed which separates out the effects of the main signal transition from any ringing that may occur after the transition. The peak detector captures the peak value of Vslp such as described above performed by peak detector 125a. A separate analogous circuit (not shown) may be used to capture negative going Vslp pulses for falling Vout transitions.

The peak value sensed by the peak detector 125a may be averaged in the analog domain or be analog to digital converted and averaged over several transitions. The filtering provided by the filter in the blanking, peak detector, filtering circuit 300 can be used to determine the reaction time of the loop. Vslp after processing by blanking/filtering and peak detector 125' besides being compared to low and high voltage thresholds by comparator 135a and 135b, respectively, as shown, can be fed to other circuits or algorithms. Alternatively, as shown, the output of the comparator 135a and 135b can be used to directly provide a control for the gate driver with slew rate control as 121/122.

Although FIG. 1 and FIG. 2 both show half-bridge output stages, disclosed embodiments can also be applied to full bridge output stages, where there will be two different output nodes in the devices output stage (complementary outputs). In full bridge applications, there will be two disclosed gate drivers with adaptive slew rate control circuits, one for each of the complementary output stages.

Figure 4:
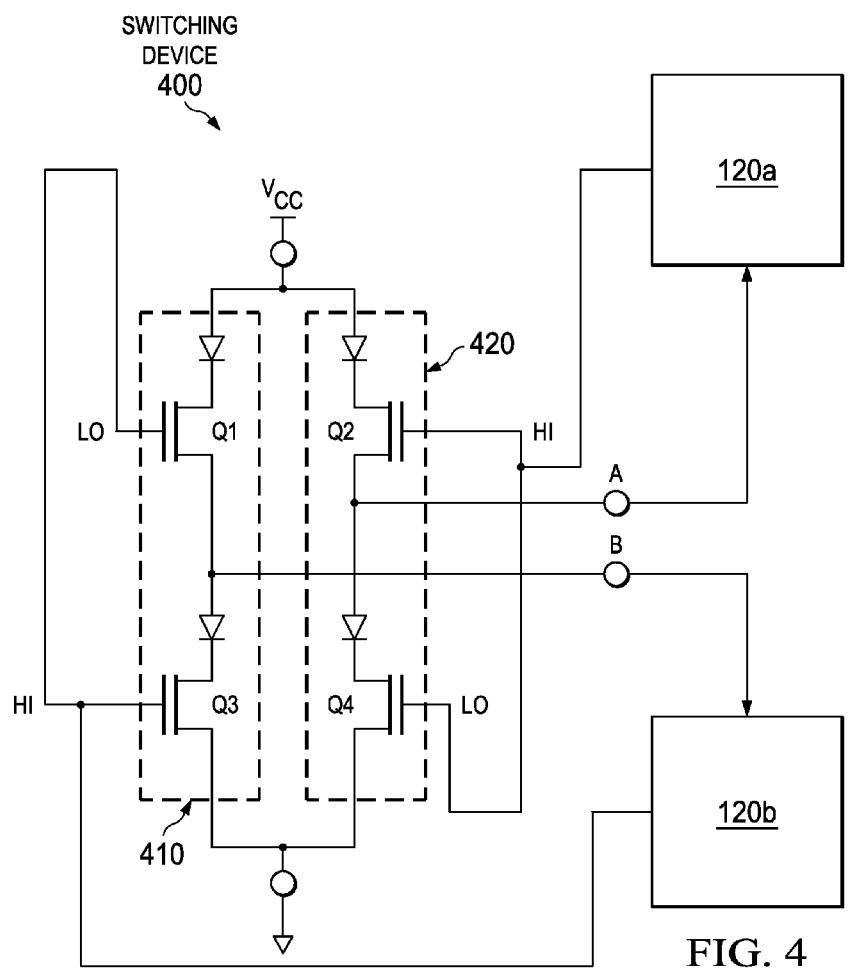
FIG. 4 is depiction of an example switching device having a full bridge output stage comprising complementary output stages including a disclosed example gate driver with a slew rate control circuit for each of the output stages, according to an example embodiment.

FIG. 4 is depiction of an example switching device 400 having a full bridge output stage comprising complementary output stages including a disclosed example gate driver with slew rate control circuitry shown as 120a and 120b for each of the output stages, according to an example embodiment. The first output stage 410 is shown including power MOS transistors Q1 and Q3, and the second output stage 420 is shown including power MOS transistors Q2 and Q4. Gate driver with slew rate control circuit 120a is coupled to output A to receive as its input and its output to the gates of Q2 and Q4 to control those gates, and gate driver with slew rate control circuit 120b is coupled between output B to receive as its input and its output to the gates of Q1 and Q3 to control those gates. For the case of generality, the diodes shown in the respective output shown can be removed.

Figure 5:
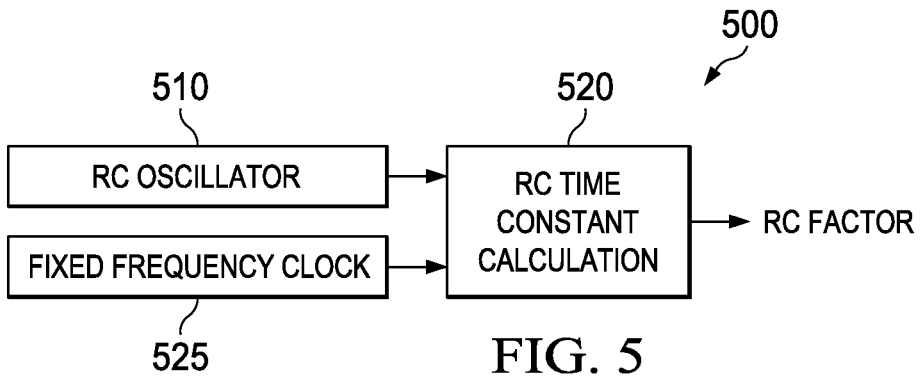
FIG. 5 shows an example RC factor calculating circuit, according to an example embodiment.

FIG. 5 shows an example RC factor calculating circuit (RC calculating circuit) 500, according to an example embodiment. RC calculating circuit 500 includes an RC oscillator 510 and a fixed frequency clock 525 that provides inputs to a RC time constant calculation block 520 that adaptively outputs an RC factor. Fixed frequency clock 525 provides a well-controlled fixed clock frequency such as provided by a conventional PWM clock. The RC factor output of the RC calculating circuit 500 is part of the slew rate control circuitry 130 shown in FIG. 1 as Vslp=RC*slew rate. Since a related goal is to achieve a certain slew rate, knowing RC ensures Vslp equals RC*desired slew rate (dVout/dt). An RC calculation is generally utilized for determining the current RC factor value since typically it varies from chip to chip (and with temperature).

Figure 6B:
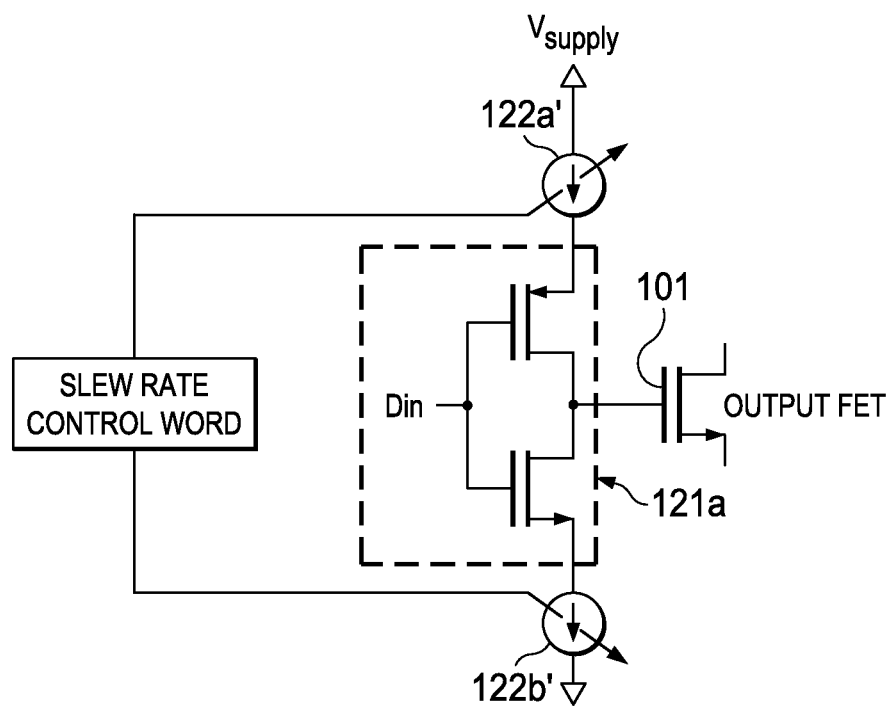
FIG. 6B shows an example gate driver with slew rate control block that can be used as the gate drivers with slew rate control in FIG. 6A, according to an example embodiment.
Figure 6A:
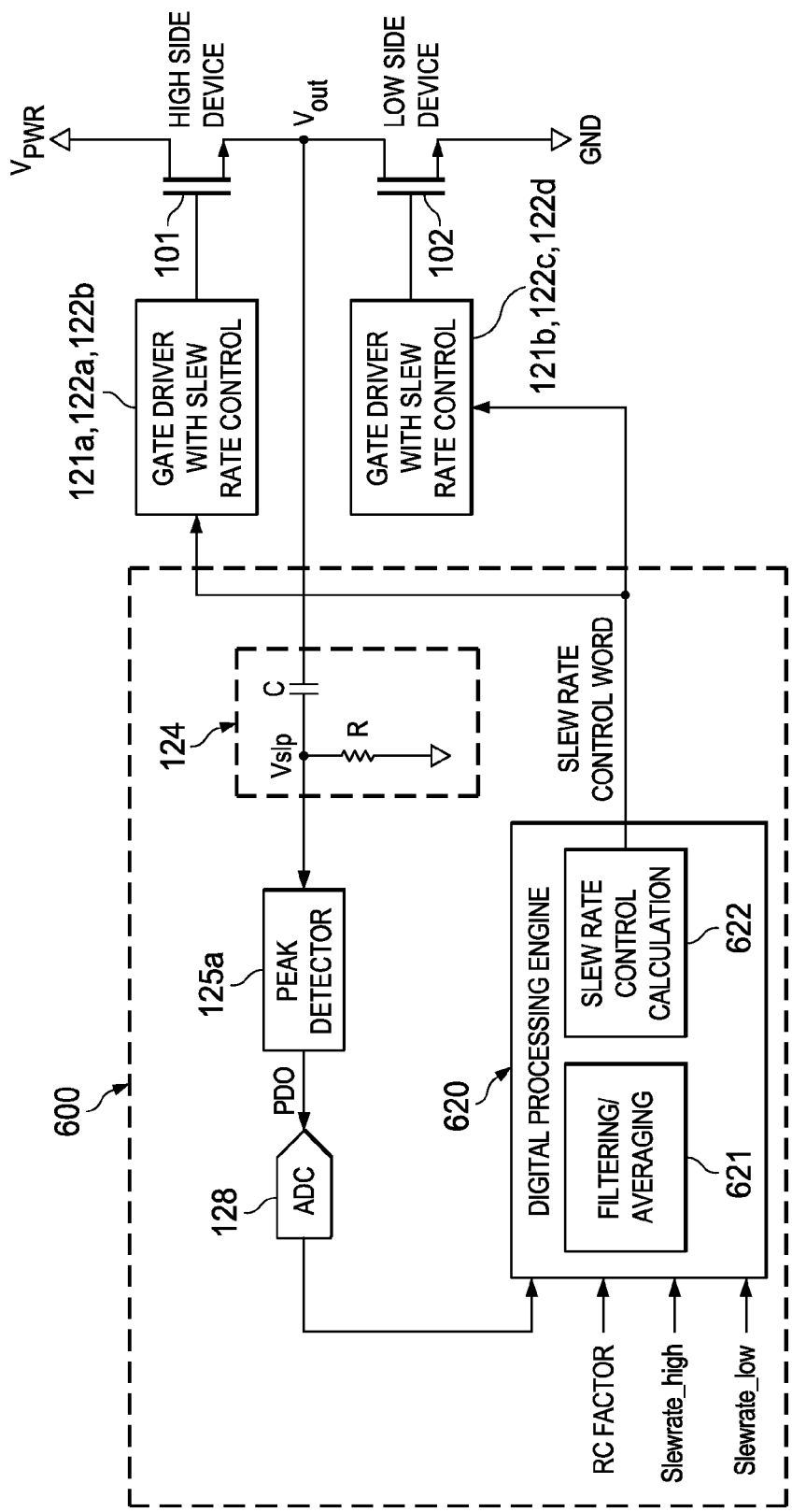
FIG. 6A shows an implementation example of a digital slew rate control loop in current technology, according to an example embodiment.

FIG. 6A shows an implementation example of a slew rate control loop 600 in current technology. The PDO of the peak detector 125a is digitally converted by ADC 128 and used as an input to digital processing engine 620, along with an RC factor, a predetermined high slew rate limit and a predetermined low slew rate limit. The RC factor is an input to the digital processing engine (implemented as hardware and/or software) 620. Digital processing engine 620 is shown including filtering/averaging block 621 and slew rate control calculation circuit 622. Digital processing engine 620 is shown providing a slew rate control word which is coupled to the gate driver with slew rate control 121a/122a, 122b and gate driver with slew rate control 121b/122c, 122d.

FIG. 6B shows an example gate driver with slew rate control block that can be used as gate driver with slew rate control 121a/122a, 122b and gate driver with slew rate control 121b/122c, 122d in FIG. 6A. The adjustable current sources 122a' and 122b' can be current limiting digital-to-analog converters (DACs) which receive the slew rate control word as a digital input from the output of the digital processing engine 620 shown in FIG. 6A and generates a quantized (discrete step) analog output in response to a digital input code. The adjustable current sources 122a' and 122b' as DACs also limit the switching current of the PMOS and NMOS devices in the gate driver 121a.

Figure 7:
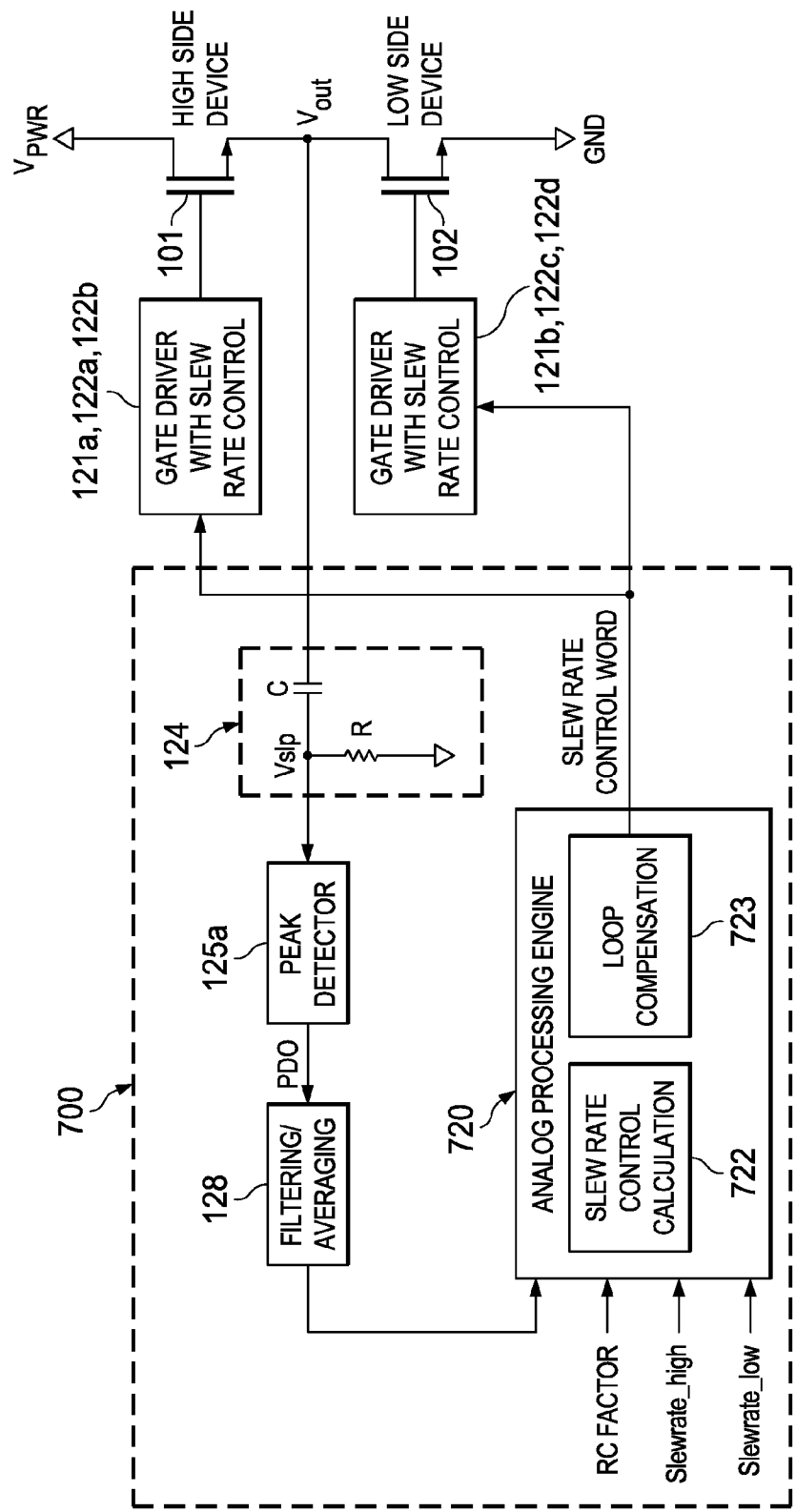
FIG. 7 shows an example analog implementation of an example slew rate control loop in current technology that closely resembles the digital slew rate control loop shown in FIG. 6A.

FIG. 7 shows an example analog implementation of a slew rate control loop 700 in current technology that closely resembles the slew rate control loop 600 shown in FIG. 6A. The RC factor is an analog input to the analog processing engine 720 shown including slew rate control calculation circuit 722 and loop compensation 723. Analog processing engine 720 is shown providing a slew rate control word which is coupled to the gate driver with slew rate control 121a/122a, 122b and gate driver with slew rate control 121b/122c, 122d.

One benefit of disclosed adaptive slew rate measurements is that in a class D amplifier application where a speaker load is disconnected on one side, the slew rate on that side will be significantly different from the slew rate on the other side that is not disconnected. This helps detect that the speaker is disconnected on one side. When there is no sound coming out of the speaker, it is helpful for the system to be able to indicate that no sound is provided because the speaker got disconnected, rather than the amplifier became inoperable.

Other advantages of disclosed embodiments include the HPF for detecting a slew rate of the switching transistor(s) in the output stage enables disclosed slope measurement to allow the circuitry processing the Vslp pulse signal to be isolated from the high voltage at OUT that may be generated by the high voltage driver and output circuitry. By separating the slope measurement circuitry from high voltage as noted above, the comparison and slope control functions provided by the detection signal processing circuitry 125 and slew rate control circuitry 130 can thus both be implemented in low voltage circuitry and with a wide range of control algorithm options. Since Vslp represents the slope of Vout (dVout/dt) and is generally scaled by an RC time constant, with a clock with a well-controlled fixed frequency (such as provided by a pulse width modulation (PWM) clock), the RC scaling term can be calibrated continuously to account for temperature and aging variations in the peak value of Vslp. As the temperature changes, R and C will both generally change in value. By continually running the RC time constant calculation block 520 the RC factor computed changes with temperature and keeps up with the changing value of the height of Vslp (for the same slew rate).

Since disclosed slew rate control is adaptive, it can handle widely varying conditions affecting slew rate and it can be programmed to adjust the slew rate based on as given application. The inputs Slewrate_HI and Slewrate_LO (typically digital input words programmed into a register) in FIG. 6A will translate to Vref LO and Vref HI in FIG. 3. The programming involves changing the levels Slewrate_HI and Slewrate_LO depending on the application. For example in one application with relatively easy electromagnetic interference (EMI) specifications (Slewrate_HI, Slewrate_LO) may be set to (10 V/ns, 9 V/ns) and in another application with more stringent EMI specifications it may be set to (3 V/ns, 2 V/ns).

EXAMPLES

Disclosed embodiments are further illustrated by the following specific Examples, which should not be construed as limiting the scope or content of this Disclosure in any way.

Figure 8:
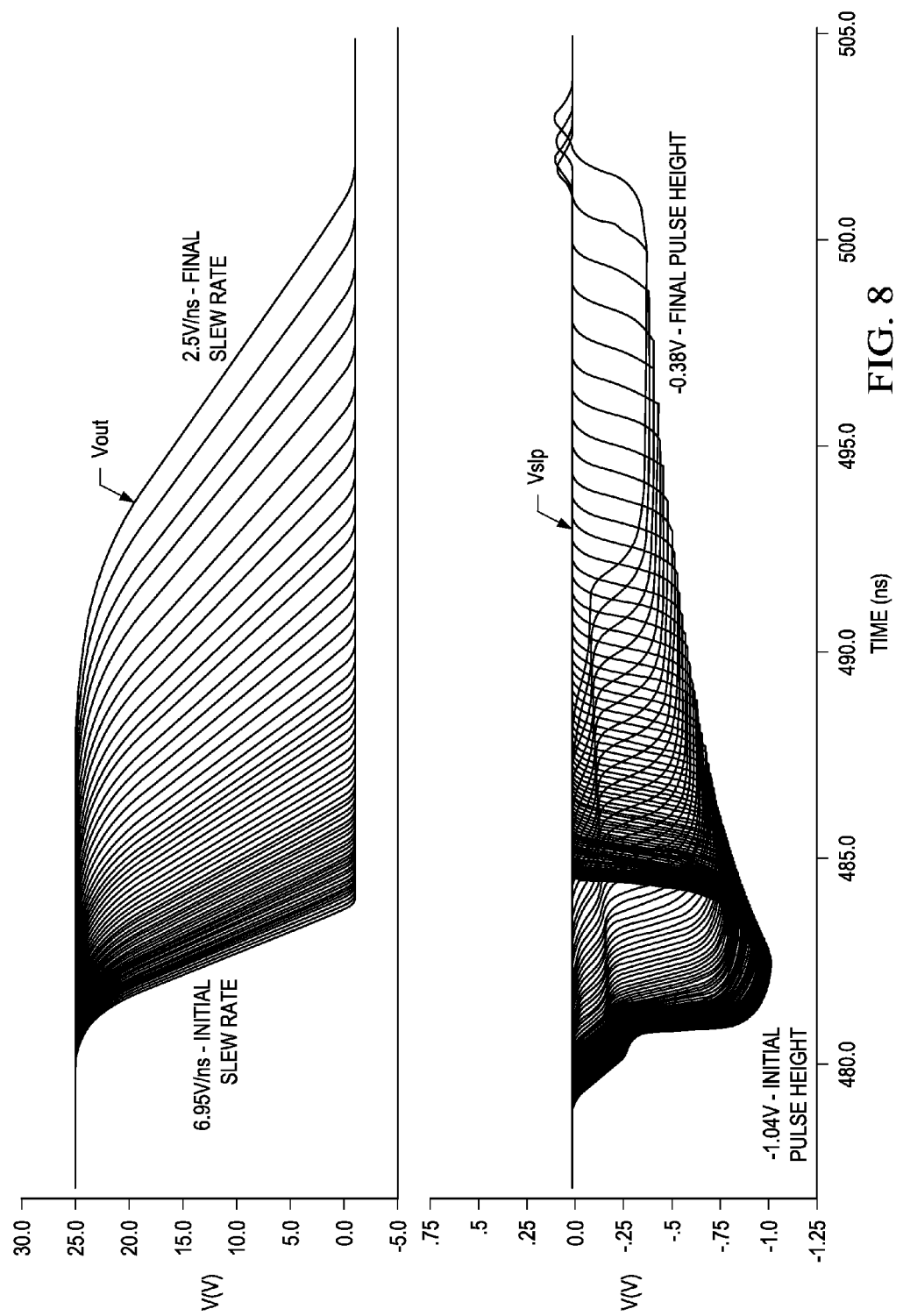
FIG. 8 are simulation waveforms showing voltage vs. time performance including overlapping switching waveforms taken at the OUT of a buck converter showing operation of a disclosed analog slew rate control loop that brings the slew rate of the falling edge from 6.95 V/ns to a desired range by adjustment to 2.5 V/ns.

FIG. 8 are simulation waveforms showing voltage vs. time performance including overlapping switching waveforms taken at the OUT of a buck converter involving a half bridge analogous to that shown in FIG. 6A, showing operation of a disclosed analog slew rate control loop that brings the slew rate of the falling edge from 6.95 V/ns to a desired range by adjustment to 2.5 V/ns (see top plot). Overlapping the falling edges makes loop progression easier to visualize. The delay through the gate driver increases with a lower slew rate in this implementation. The initial Vslp pulse height is seen to decrease in magnitude from −1.04 V to −0.38V as the slew rate decreases comes down (see bottom plot).

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A driver with adaptive slew rate control (adaptive driver), comprising:
 a gate driver including at least one driving transistor for driving a control node of at least one switching transistor within an output stage that includes an output node (OUT) which provides a voltage output (Vout);
 an adjustable current source in series with said driving transistor;
 a high pass filter (HPF) coupled between said OUT and a ground for detecting a slew rate of said switching transistor by outputting a voltage pulse (Vslp) at an output of said HPF having a peak voltage amplitude at least monotonically reflecting a slope of Vout during its switching transition;
 detection signal processing circuitry coupled to said output of said HPF for processing said Vslp and outputting a processed detection signal;
 slew rate control circuitry having an input coupled to said output of said detection signal processing circuitry for receiving said processed detection signal, wherein an output of said slew rate control circuitry is coupled to said adjustable current source for controlling a level of current of said adjustable current source (current level), said current level for changing said slew rate of said switching transistor;
 further comprising a peak detector coupled to receive said Vslp and provide a peak detector output (PDO), a first comparator for comparing a low vref level to said PDO and a second comparator for comparing a high vref level to said PDO, wherein outputs of said first and second comparator are coupled to said input of said slew rate control circuitry.

2. A driver with adaptive slew rate control (adaptive driver), comprising:
 a gate driver including at least one driving transistor for driving a control node of at least one switching transistor within an output stage that includes an output node (OUT) which provides a voltage output (Vout);
 an adjustable current source in series with said driving transistor;
 a high pass filter (HPF) coupled between said OUT and a ground for detecting a slew rate of said switching transistor by outputting a voltage pulse (Vslp) at an output of said HPF having a peak voltage amplitude at least monotonically reflecting a slope of Vout during its switching transition;
 detection signal processing circuitry coupled to said output of said HPF for processing said Vslp and outputting a processed detection signal;
 slew rate control circuitry having an input coupled to said output of said detection signal processing circuitry for receiving said processed detection signal, wherein an output of said slew rate control circuitry is coupled to said adjustable current source for controlling a level of current of said adjustable current source (current level), said current level for changing said slew rate of said switching transistor;
 wherein an RC time constant of said HPF less than said slew rate.

3. A driver with adaptive slew rate control (adaptive driver), comprising:
 a gate driver including at least one driving transistor for driving a control node of at least one switching transistor within an output stage that includes an output node (OUT) which provides a voltage output (Vout);
 an adjustable current source in series with said driving transistor;
 a high pass filter (HPF) coupled between said OUT and a ground for detecting a slew rate of said switching transistor by outputting a voltage pulse (Vslp) at an output of said HPF having a peak voltage amplitude at least monotonically reflecting a slope of Vout during its switching transition;
 detection signal processing circuitry coupled to said output of said HPF for processing said Vslp and outputting a processed detection signal;
 slew rate control circuitry having an input coupled to said output of said detection signal processing circuitry for receiving said processed detection signal, wherein an output of said slew rate control circuitry is coupled to said adjustable current source for controlling a level of current of said adjustable current source (current level), said current level for changing said slew rate of said switching transistor;
 wherein said output stage comprises a full bridge output stage comprising complementary output stages comprising one of said gate driver and said adjustable current source for each of said complementary output stages.

4. A driver with adaptive slew rate control (adaptive driver), comprising:

a gate driver including at least one driving transistor for driving a control node of at least one switching transistor within an output stage that includes an output node (OUT) which provides a voltage output (Vout);

an adjustable current source in series with said driving transistor;

a high pass filter (HPF) coupled between said OUT and a ground for detecting a slew rate of said switching transistor by outputting a voltage pulse (Vslp) at an output of said HPF having a peak voltage amplitude at least monotonically reflecting a slope of Vout during its switching transition;

detection signal processing circuitry coupled to said output of said HPF for processing said Vslp and outputting a processed detection signal;

slew rate control circuitry having an input coupled to said output of said detection signal processing circuitry for receiving said processed detection signal, wherein an output of said slew rate control circuitry is coupled to said adjustable current source for controlling a level of current of said adjustable current source (current level), said current level for changing said slew rate of said switching transistor;

further comprising:

a peak detector coupled to receive said Vslp and provide a peak detector output (PDO);

an analog-to-digital converter (ADC) coupled to receive said PDO for digitally converting said PDO;

a digital processing engine having an input coupled to an output of said ADC along with an RC factor representing said HPF, a predetermined high slew rate limit and a predetermined low slew rate limit, wherein said digital processing engine provides a slew rate control word which is coupled to a gate of said gate driver.

5. The adaptive driver of claim 4, wherein said digital processing engine comprises a filtering/averaging block and slew rate control calculation circuit.

6. A driver with adaptive slew rate control (adaptive driver), comprising:

a gate driver including at least one driving transistor for driving a control node of at least one switching transistor within an output stage that includes an output node (OUT) which provides a voltage output (Vout);

an adjustable current source in series with said driving transistor;

a high pass filter (HPF) coupled between said OUT and a ground for detecting a slew rate of said switching transistor by outputting a voltage pulse (Vslp) at an output of said HPF having a peak voltage amplitude at least monotonically reflecting a slope of Vout during its switching transition;

detection signal processing circuitry coupled to said output of said HPF for processing said Vslp and outputting a processed detection signal;

slew rate control circuitry having an input coupled to said output of said detection signal processing circuitry for receiving said processed detection signal, wherein an output of said slew rate control circuitry is coupled to said adjustable current source for controlling a level of current of said adjustable current source (current level), said current level for changing said slew rate of said switching transistor;

further comprising:

a peak detector coupled to receive said Vslp and provide a peak detector output (PDO);

a filtering and averaging block for processing said PDO, and an analog processing engine having an input coupled to an output of said filtering and averaging block along with a predetermined high slew rate limit and a predetermined low slew rate limit as other inputs, wherein said analog processing engine provides a slew rate control word which is coupled to said gate driver.

7. The adaptive driver of claim 6, wherein said analog processing engine comprises a slew rate control calculation circuit and a loop compensation circuit.

8. A driver with adaptive slew rate control (adaptive driver), comprising:

a gate driver including at least one driving transistor for driving a control node of at least one switching transistor within an output stage that includes an output node (OUT) which provides a voltage output (Vout);

an adjustable current source in series with said driving transistor;

a high pass filter (HPF) coupled between said OUT and a ground for detecting a slew rate of said switching transistor by outputting a voltage pulse (Vslp) at an output of said HPF having a peak voltage amplitude at least monotonically reflecting a slope of Vout during its switching transition;

detection signal processing circuitry coupled to said output of said HPF for processing said Vslp and outputting a processed detection signal;

slew rate control circuitry having an input coupled to said output of said detection signal processing circuitry for receiving said processed detection signal, wherein an output of said slew rate control circuitry is coupled to said adjustable current source for controlling a level of current of said adjustable current source (current level), said current level for changing said slew rate of said switching transistor;

further comprising a first substrate having a first semiconductor surface, wherein said adaptive driver is formed on said first substrate, and wherein said output stage is formed on a second substrate having a second semiconductor surface.

9. A driver with adaptive slew rate control (adaptive driver), comprising:

a gate driver including at least one driving transistor for driving a control node of at least one switching transistor within an output stage that includes an output node (OUT) which provides a voltage output (Vout);

an adjustable current source in series with said driving transistor;

a high pass filter (HPF) coupled between said OUT and a ground for detecting a slew rate of said switching transistor by outputting a voltage pulse (Vslp) at an output of said HPF having a peak voltage amplitude at least monotonically reflecting a slope of Vout during its switching transition;

detection signal processing circuitry coupled to said output of said HPF for processing said Vslp and outputting a processed detection signal;

slew rate control circuitry having an input coupled to said output of said detection signal processing circuitry for receiving said processed detection signal, wherein an output of said slew rate control circuitry is coupled to said adjustable current source for controlling a level of current of said adjustable current source (current level), said current level for changing said slew rate of said switching transistor;

further comprising an RC factor calculating circuit (RC calculating circuit) comprising an RC oscillator and a fixed frequency clock as inputs to a RC time constant calculation block that adaptively generates an RC factor that is coupled to said slew rate control circuitry.

10. A method of adaptive slew rate control, comprising:
coupling a high pass filter (HPF) between an output (OUT) of an output stage and a ground, said output stage comprising at least one switching transistor which provides a voltage output (Vout) having a control node of said switching transistor driven by a gate driver that includes at least one driving transistor, wherein there is an adjustable current source in series with said driving transistor;
during a switching transition of said switching transistor, said HPF detecting a slew rate of said switching transistor as a voltage pulse (Vslp) having a peak voltage amplitude that at least monotonically reflects a slope of Vout during said switching transition;
signal processing said Vslp to output a processed detection signal;
comparing said processed detection signal to a high reference level that reflects an upper slew rate limit and to a low reference level that reflects a lower slew rate limit, and
changing a current level of said adjustable current source to change said slew rate of said switching transistor so that a resulting adjusted slew rate of said switching transistor is set between said lower slew rate limit and said upper slew rate limit;
wherein said peak voltage amplitude is averaged over a plurality of said switching transitions.

11. A method of adaptive slew rate control, comprising:
coupling a high pass filter (HPF) between an output (OUT) of an output stage and a ground, said output stage comprising at least one switching transistor which provides a voltage output (Vout) having a control node of said switching transistor driven by a gate driver that includes at least one driving transistor, wherein there is an adjustable current source in series with said driving transistor;
during a switching transition of said switching transistor, said HPF detecting a slew rate of said switching transistor as a voltage pulse (Vslp) having a peak voltage amplitude that at least monotonically reflects a slope of Vout during said switching transition;
signal processing said Vslp to output a processed detection signal;
comparing said processed detection signal to a high reference level that reflects an upper slew rate limit and to a low reference level that reflects a lower slew rate limit, and
changing a current level of said adjustable current source to change said slew rate of said switching transistor so that a resulting adjusted slew rate of said switching transistor is set between said lower slew rate limit and said upper slew rate limit;
wherein said signal processing comprises peak detecting said Vslp to provide a peak detector output (PDO), and said comparing comprises using a first comparator for comparing a low vref level to said PDO and using a second comparator for comparing a high vref level to said PDO, wherein outputs of said first and second comparator are coupled to an input of slew rate control circuitry that has an output coupled to said control node of said gate driver.

12. A method of adaptive slew rate control, comprising:
coupling a high pass filter (HPF) between an output (OUT) of an output stage and a ground, said output stage comprising at least one switching transistor which provides a voltage output (Vout) having a control node of said switching transistor driven by a gate driver that includes at least one driving transistor, wherein there is an adjustable current source in series with said driving transistor;
during a switching transition of said switching transistor, said HPF detecting a slew rate of said switching transistor as a voltage pulse (Vslp) having a peak voltage amplitude that at least monotonically reflects a slope of Vout during said switching transition;
signal processing said Vslp to output a processed detection signal;
comparing said processed detection signal to a high reference level that reflects an upper slew rate limit and to a low reference level that reflects a lower slew rate limit, and
changing a current level of said adjustable current source to change said slew rate of said switching transistor so that a resulting adjusted slew rate of said switching transistor is set between said lower slew rate limit and said upper slew rate limit;
wherein said signal processing further comprising analog-to-digital converting so that said processed detection signal is a digital detection signal, further comprising digitally processing said digital detection signal, an RC factor representing said HPF, said upper slew rate limit and said lower slew rate limit to generate a slew rate control word which is coupled to a gate of said gate driver that is used for said changing.

13. The method of claim 12, further comprising adaptively generating said RC factor.

14. The method of claim 12, wherein said adaptively generating said RC factor comprises using an RC calculating circuit comprising an RC oscillator and a fixed frequency clock as inputs to a RC time constant calculation block.

15. A method of adaptive slew rate control, comprising:
coupling a high pass filter (HPF) between an output (OUT) of an output stage and a ground, said output stage comprising at least one switching transistor which provides a voltage output (Vout) having a control node of said switching transistor driven by a gate driver that includes at least one driving transistor, wherein there is an adjustable current source in series with said driving transistor;
during a switching transition of said switching transistor, said HPF detecting a slew rate of said switching transistor as a voltage pulse (Vslp) having a peak voltage amplitude that at least monotonically reflects a slope of Vout during said switching transition;
signal processing said Vslp to output a processed detection signal;
comparing said processed detection signal to a high reference level that reflects an upper slew rate limit and to a low reference level that reflects a lower slew rate limit, and
changing a current level of said adjustable current source to change said slew rate of said switching transistor so that a resulting adjusted slew rate of said switching transistor is set between said lower slew rate limit and said upper slew rate limit;
wherein said signal processing comprises:
peak detecting said Vslp to provide a peak detector output (PDO) and filtering and averaging said PDO;
and wherein said comparing comprises using an analog processing engine having an input coupled to an output of said filtering and averaging block along with a predetermined high slew rate limit and a predetermined low slew rate limit as other inputs, wherein said analog processing engine provides a slew rate control word which is coupled to said gate driver that is used for said changing.

16. A method of adaptive slew rate control, comprising:

coupling a high pass filter (HPF) between an output (OUT) of an output stage and a ground, said output stage comprising at least one switching transistor which provides a voltage output (Vout) having a control node of said switching transistor driven by a gate driver that includes at least one driving transistor, wherein there is an adjustable current source in series with said driving transistor;

during a switching transition of said switching transistor, said HPF detecting a slew rate of said switching transistor as a voltage pulse (Vslp) having a peak voltage amplitude that at least monotonically reflects a slope of Vout during said switching transition;

signal processing said Vslp to output a processed detection signal;

comparing said processed detection signal to a high reference level that reflects an upper slew rate limit and to a low reference level that reflects a lower slew rate limit, and changing a current level of said adjustable current source to change said slew rate of said switching transistor so that a resulting adjusted slew rate of said switching transistor is set between said lower slew rate limit and said upper slew rate limit;

wherein said output stage comprises a full bridge output stage comprising complementary output stages comprising one of said gate driver and said adjustable current source for each of said complementary output stages.

* * * * *